United States Patent [19]

Nakazawa et al.

[11] 4,423,959

[45] Jan. 3, 1984

[54] POSITIONING APPARATUS

[75] Inventors: Kiwao Nakazawa, Tokyo; Kyoichi Suwa, Kawasaki; Shoichiro Yoshida, Tokyo, all of Japan

[73] Assignee: Nippon Kogaku K.K., Tokyo, Japan

[21] Appl. No.: 473,042

[22] Filed: Mar. 7, 1983

Related U.S. Application Data

[63] Continuation of Ser. No. 267,435, May 27, 1981, abandoned.

[30] Foreign Application Priority Data

Jul. 10, 1980 [JP] Japan .................................. 55-93223

[51] Int. Cl.³ ............................................. G01B 11/00
[52] U.S. Cl. .................................... 356/400; 356/363; 356/401
[58] Field of Search ............... 356/354, 356, 358, 363, 356/399–401; 250/561

[56] References Cited

U.S. PATENT DOCUMENTS 3,861,798  1/1975  Kobayashi et al. .................. 356/363
4,252,442  2/1981  Dandliker et al. ................... 356/363

OTHER PUBLICATIONS

Khoury, H. A. "Analog Automatic Wafer Alignment for Fine Positioning", IBM Tech. Disc. Bull, 3–1975, p. 2895.

Trotel et al. "Optical Alignment System for Submicron X-Ray Lithography", J. Vac. Sci. Tech. 16(6), (Nov./-Dec. 1979) pp. 1954–1958.

*Primary Examiner*—William H. Punter
*Attorney, Agent, or Firm*—Shapiro and Shapiro

[57] ABSTRACT

A positioning apparatus includes a projecting means for projecting plural coherent light beams onto an object to be aligned. The projecting means comprises plural converging means for forming each coherent light beam into a stripe-shaped beam extended in a direction substantially perpendicularly to the scanning direction of said scanning means, and each of said alignment marks comprises plural short line segments arranged in a stripe extended in a direction substantially perpendicular to the scanning direction of said scanning means and each inclined approximately by 45° with respect to said scanning direction. Therefore, the alignment mark can be clearly identified from the circuit patterns by relatively rough preliminary alignment even if such mark is positioned in a narrow space between the chips for example for LSI.

14 Claims, 15 Drawing Figures

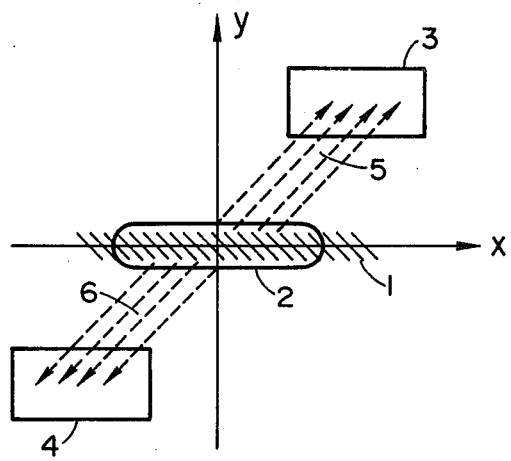
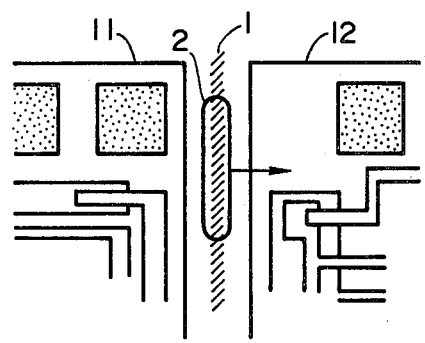
FIG. 1  FIG. 2
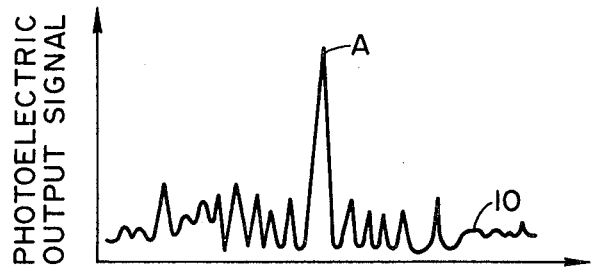
FIG. 3
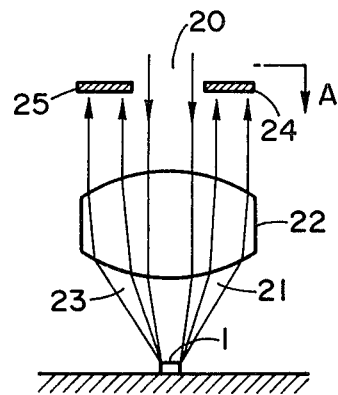
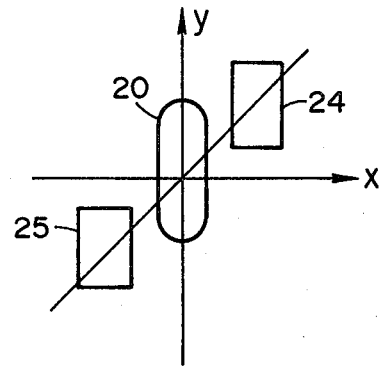
FIG. 4A  FIG. 4B

FIG. 11A           FIG. 11B
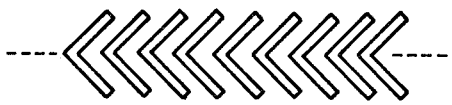
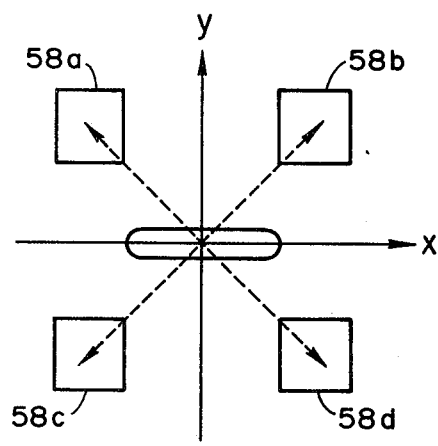
FIG. 12A           FIG. 12B

POSITIONING APPARATUS

BACKGROUND OF THE INVENTION

This application is a continuation of application Ser. No. 267,435 filed May 27, 1981, now abandoned.

FIELD OF THE INVENTION

The present invention relates to a positioning apparatus for positioning or aligning an object to a predetermined position, and more particularly to a positioning apparatus for circuit pattern positioning in the production of integrated circuits (IC) and of large-scale integrated circuits (LSI).

DESCRIPTION OF THE PRIOR ART

Apparatus for automatic positioning of an object are already in use in various fields. Particularly in the optical printing on semiconductor, "automatic alignment" with which integrated circuit patterns of two kinds of or more photomasks are automatically positioned with predetermined relation to the semi-conductor wafer is indispensable for reducing the fatigue of operator and achieving high-speed precise positioning. The requirement for precision of alignment is becoming strictor particularly in the recent printer of reduction projection type which has enabled the optical printing of line width in the order of 1 μm. In such reduction projection printer, the mask-wafer alignment has been achieved either through the projection lens or by respective alignment of the mask and the wafer by the use of no projection lens. The latter, called off-axis method, is advantageous in shorter aligning time, due to the use of a microscope provided exclusively for the alignment. In this method the error in alignment is photoelectrically detected by slit scanning or scanning with an industrial television camera of the optical image.

Though not practiced in the off-axis method, it is also possible to photoelectrically determine the pattern position by scanning the wafer with a laser beam spot or a CRT flying beam spot in a similar manner as in the slit scanning of the optical image.

In the above-mentioned aligning methods, the alignment marks provided on the wafer for positioning the circuit patterns alone have to be suitably separated therefrom as otherwise the photoelectric signals from those alignment marks are not easily identifiable from those from the circuit patterns. For this reason it has been necessary to provide the alignment marks in an area where the chips of circuit pattern can be printed thus sacrificing the number of LSI to be made, or, in case of providing the alignment marks in the stripe portions between the chips, to conduct precise alignment in advance on such stripe portions alone.

SUMMARY OF THE INVENTION

The object of the present invention is to provide an apparatus not associated with the aforementioned drawbacks and capable of automatically identifying the alignment marks alone even if they are positioned close to the circuit patterns, thereby enabling rapid and precise positioning.

The foregoing object is achieved according to the present invention by composing the alignment mark with a group of short line segments inclined approximately by 45° to either of mutually perpendicular directions of the circuit segments in the circuit pattern, said group being extended as a stripe along one of said directions, and employing a coherent light beam such as a laser beam, for detecting said alignment mark, converged as a stripe extended in a direction substantially parallel to that of the stripe of the alignment mark, whereby the positioning is achieved by the light diffracted from the short line segments and obtained by scanning said converged beam stripe along the direction of circuit.

According to the present invention the alignment mark can be clearly identified from the circuit patterns by relatively rough preliminary alignment even if such mark is positioned in a narrow space between the chips for example for large-scale integrated circuit. It is thus made possible to position the alignment mark in the vicinity of the circuit patterns. Also since the laser beam is utilized as a stripe-shaped spot and the alignment mark is composed of a group of short line segments, it is rendered possible, particularly in high-speed scanning, to improve the signal-to-noise ratio and stability of the photoelectric signal, thus enabling to curtail the time required for alignment with a relatively simple signal processing system.

BRIEF DESCRIPTION OF THE DRAWINGS

FIG. 1 is a schematic view showing the principle of the present invention;

FIG. 2 is a view showing the arrangement of an alignment mark and circuit patterns on a wafer according to an embodiment of the present invention;

FIG. 3 is a chart showing the behavior of the photoelectric signal from the detector;

FIGS. 4A and 4B are views showing a part of optical system for alignment detection;

FIGS. 11A and 11B are enlarged views showing an embodiment of the alignment mark;

FIG. 12A is a enlarged view of another embodiment of the alignment mark; and

FIG. 12B is a schematic view showing the arrangement of the detector.

DESCRIPTION OF THE PREFERRED EMBODIMENT

Figure 5:
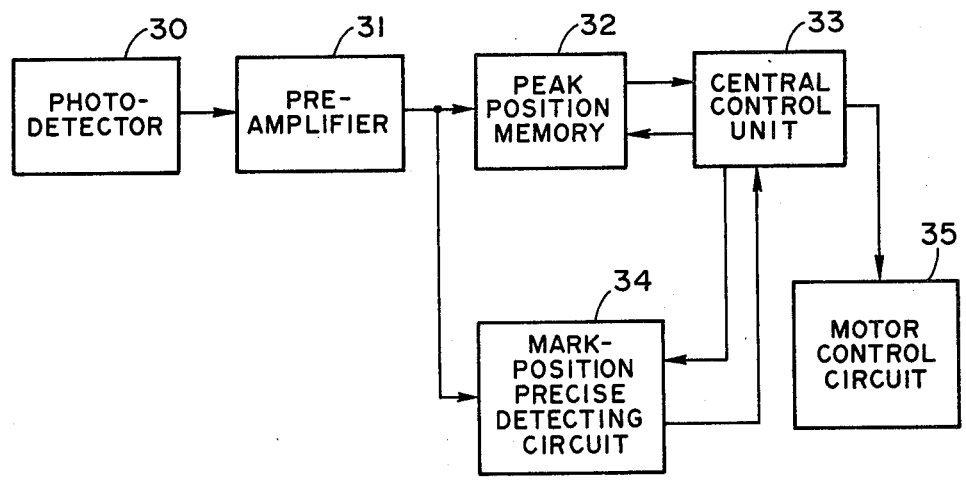
FIG. 5 is a block diagram of the signal processing system.

FIG. 1 shows the working principle of the present invention on a wafer surface having circuit patterns, wherein the perpendicular axes x and y represent the directions of segments of circuit pattern on the semiconductor chip. An alignment mark 1 is composed of a group of short line segments inclined approximately by 45° to said axes x, y, said segments being so arranged as to have a stripe-shaped envelope. For the purpose of explanation each of said segments will hereafter be referred to as element. The detection of position is achieved by a coherent light beam 2 obtained from a laser and extended in one direction into a stripe-shaped spot beam. The formation of such extended spot beam from a laser beam is for example disclosed in the Japanese Patent Laid-Open No. 119074/1978 to the present applicant. In the present embodiment, a laser beam entering an objective lens is so deformed between said objective lens and the light source as to have different numerical aperture in a direction of circuit pattern on the wafer and in another direction perpendicular thereto, thus forming an extended stripe-formed spot beam on the wafer. In response to said laser spot beam 2, each element of the alignment mark 1 provides diffracted beams 5, 6 to rectangular areas 3, 4 at a certain height from the wafer surface, in which photoelectric detectors are positioned. The scanning with said spot beam 2 relative to the wafer is conducted in the direction of y-axis in FIG. 1, and in such scanning function the areas 3, 4 are maintained in such determined positions with respect to the spot beam 2 as to selectively receive much of the diffracted beams 5, 6 from the elements.

FIG. 2 shows the relationship between the alignment mark and the circuit patterns on the wafer. The alignment mark 1 is provided along a narrow area, so-called street line, between semi-conductor chips 11, 12, and the spot beam 2 performs the scanning motion in the direction of arrow. In FIG. 2, the detectors which will be described in detail later are omitted for the purpose of simplicity. In the present embodiment, the scanning with the spot beam 2 is achieved by the displacement of a stage on which said wafer is mounted. In this manner the spot beam 2 scans the circuit pattern of the chip 11, then the alignment mark 1, and the circuit pattern of the chip 12 in succession. The diffracted beams are also generated at each edge in said circuit patterns, but, because of the combination of the alignment mark structure, scanning direction and detector arrangement as explained in FIG. 1, the photoelectric output signal from the detectors reaches maximum when the spot beam 2 falls on the alignment mark 1 as shown in FIG. 3, wherein the photoelectric output signal in the ordinate is represented as a function of the position of the spot beam 2 with respect to the patterns on the wafer represented on the abscissa. During the course of the scanning motion of the spot beam 2 as shown in FIG. 2, the photoelectric signal shows small peaks as shown in FIG. 3 corresponding to the edge portions of the circuit patterns extending along the scanning direction or perpendicularly thereto, but a significantly higher maximum A is reached when the spot beam 2 scans the alignment mark 1 because of the selective detection of the diffracted beams corresponding to the inclined direction of the elements of said mark 1.

FIGS. 4A and 4B show a part of the optical system for detecting the alignment mark, wherein shown are an incident beam 20, a condenser lens 22 and detectors 24, 25. In FIG. 4A, the incident beam 20 is focused by the condenser lens 22 onto the alignment mark 1 on the wafer, and the diffracted beams 21, 23 resulting therefrom are guided again through the condenser lens 22 to said detectors 24, 25. In FIG. 4B showing a view seen from a direction A in FIG. 4A and in which the condenser lens 22 is omitted, it will be understood that said incident beam 20 is extended in one direction as already explained in the foregoing and that the detectors 24, 25 are positioned with the centers thereof at a direction of 45° or −45° with respect to the axes x and y. Said positions are determined in relation to the directivity of the diffracted beams from the alignment mark 1, and should be appropriately changed if the direction of elements of said mark 1 is selected other than 45°.

Figure 6:
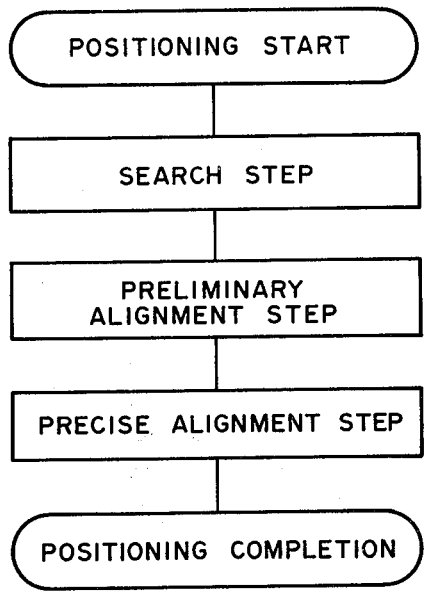
FIG. 6 is a flow chart showing the aligning function.

In the following explained is the actual aligning procedure, based on the above-explained principle, in an apparatus in which the stage is displaced until the alignment mark is detected. FIG. 5 shows a block diagram of a signal processing system for use in such apparatus, and FIG. 6 shows a flow chart of the aligning procedure thereof. In the alignment procedure, at first conducted is a search step after positioning start in which the stage is displaced at a relatively high speed to scan the possible location of the alignment mark 1 with the spot beam 2 and to search a peak position of the photoelectric signal from photodetectors 30. Said photoelectric signal is supplied, after amplification in a pre-amplifier 31, to a peak position memory 32, which stores the position of said alignment mark 1 from a reference point. After the completion of said search step, the information thus stored is supplied to a central control unit 33, which thus performs a preliminary alignment step by activating a stage drive motor through a motor control circuit 35 to displace the wafer to a position in which the spot beam 2 falls on the alignment mark 1. Successively conducted is a precise alignment step in which a mark-position precise detecting circuit 34 derives, in response to the output signal from said preamplifier 31, an error signal for processing by said central control circuit 33. In this step the stage is displaced at a lower speed and within a smaller range than in the preliminary alignment step. Also in this step the exact distance between the spot beam 2 and the alignment mark 1 is measured for example either by a method in which the output signal from the preamplifier 31 is converted into digital form and stored at the maximum value thereof, or by a method in which the laser spot beam is vibrated and the photoelectric signal is converted into a signal synchronized with said vibration and subjected to synchronized detection to determine the zero point in the smoothed detection output signal. Particularly the latter method is capable of providing the alignment error (error from the peak point) as an analog signal even when the photoelectric signal does not show a peak point in the displacement of wafer. Thus the precise alignment is achieved by a small displacement of the stage through the motor control circuit 35 in response to the error signal corresponding to said alignment error. The above-mentioned steps are appropriately switched by the central control circuit 33.

Figure 7:
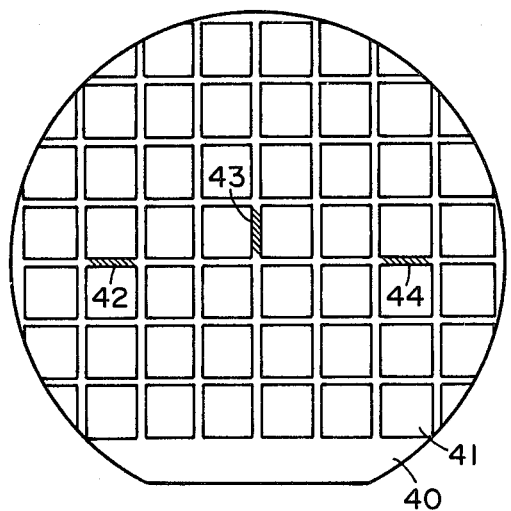
FIG. 7 is a view showing the position of the alignment marks on the wafer.

In the following explained is the two-dimensional alignment of the wafer. FIG. 7 shows an example of the arrangement of integrated circuit chips 41 formed on a wafer 40 and alignment marks 42, 43, 44, or which the marks 42 and 44 are positioned on a same street line between said chips while the third mark 43 is positioned on another perpendicular street line. The wafer shown in FIG. 7 has been subjected to a printing step of the first pattern for example in a reduction projecting printer, followed by a developing step and an etching step. Said alignment marks are exposed and etched on the wafer through a reticle having circuit patterns for first printing and also having such alignment marks in the street lines thereof. Thus, although FIG. 7 shows only three alignment marks, the wafer will be provided with the alignment marks in all the street lines between the circuit patterns in case said patterns are repeatedly exposed from a reticle having the circuit patterns for the first printing and the alignment marks. Said alignment marks 42, 43, 44 have different functions in the alignment procedure. More specifically, the marks 42 and 44 serve for detecting the rotational aberration in the wafer position and the translation aberration for example in the y-axis directional while the mark 43 serves detecting the translational aberration in the x-axis direction. For this reason said marks are hereinafter referred to respectively as Y-mark (42), θ-mark (43) and X-mark (44), and in the following explained is the procedure of alignment for re-exposure of such wafer.

Figure 8:
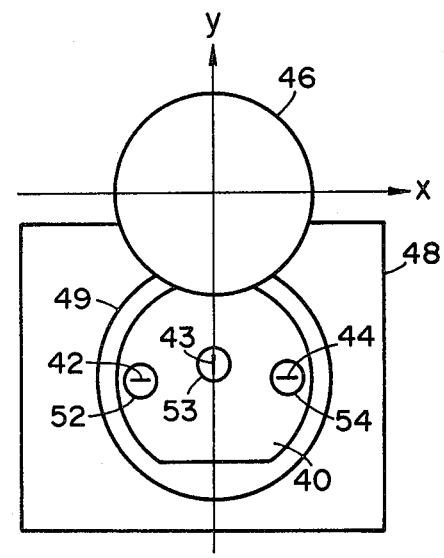
FIG. 8 is a schematic view of the apparatus for wafer alignment.

FIG. 8 is a schematic view of the apparatus for wafer alignment, as already disclosed in the preceding Japanese Patent Application No. 5156/1980, corresponding to the U.S. patent application Ser. No. 225,049, to the present applicant. The x- and y-axes are taken as illustrated, with the original point at the optical axis of a lens 46 for reduction projection of the pattern on the reticle. A wafer 40 is positioned on a rotary table 49, which is in turn supported on a stage 48 displaceable in the directions of x- and y-axes. For detecting three alignment marks there are provided three alignment optical systems as shown in FIGS. 4A and 4B; i.e. Y-sensor 52 for the Y-mark 42, θ-sensor 54 for the θ-mark 44 and X-sensor 53 for the X-mark 43, at determined positions from the optical axis of said projection lens 46. Though omitted in FIG. 8, each sensor projects to the wafer a laser spot beam extended in the direction of corresponding alignment mark as explained in the foregoing. In this manner formed is an off-axis alignment system having aligning optical systems separate from the optical path of the projection lens 46. Thus, once the wafer position based on the alignment marks is known with respect to the absolute x-y coordinate, it is rendered possible to displace an arbitrary point on the wafer to the center of said x-y coordinate by suitable movement of the stage 48. The positions of said three sensors have to be accurately determined in advance, for example according to a procedure as disclosed in the aforementioned Japanese Patent Application No. 5156/1980.

Before the wafer 40 is mounted on the table 49, the y-position of the spot beams of the Y-sensor 52 and θ-sensor 54 and the x-position of that of the X-sensor 53 are determined according to the above-mentioned procedure. The stage 48 is equipped with a device (not shown) for measuring the coordinate values thereof.

Figure 9:
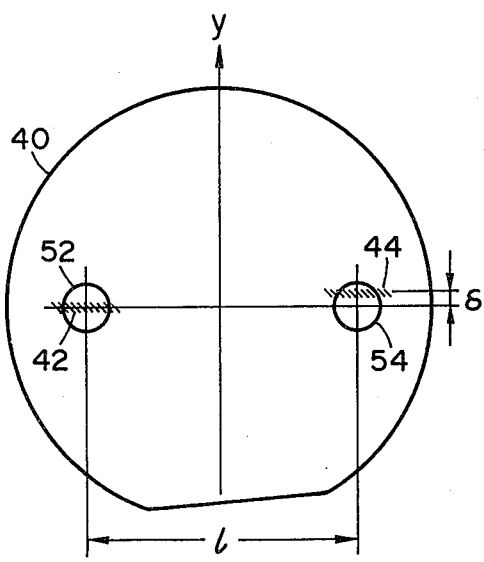
FIG. 9 is a view showing the aligning procedure.
Figure 10:
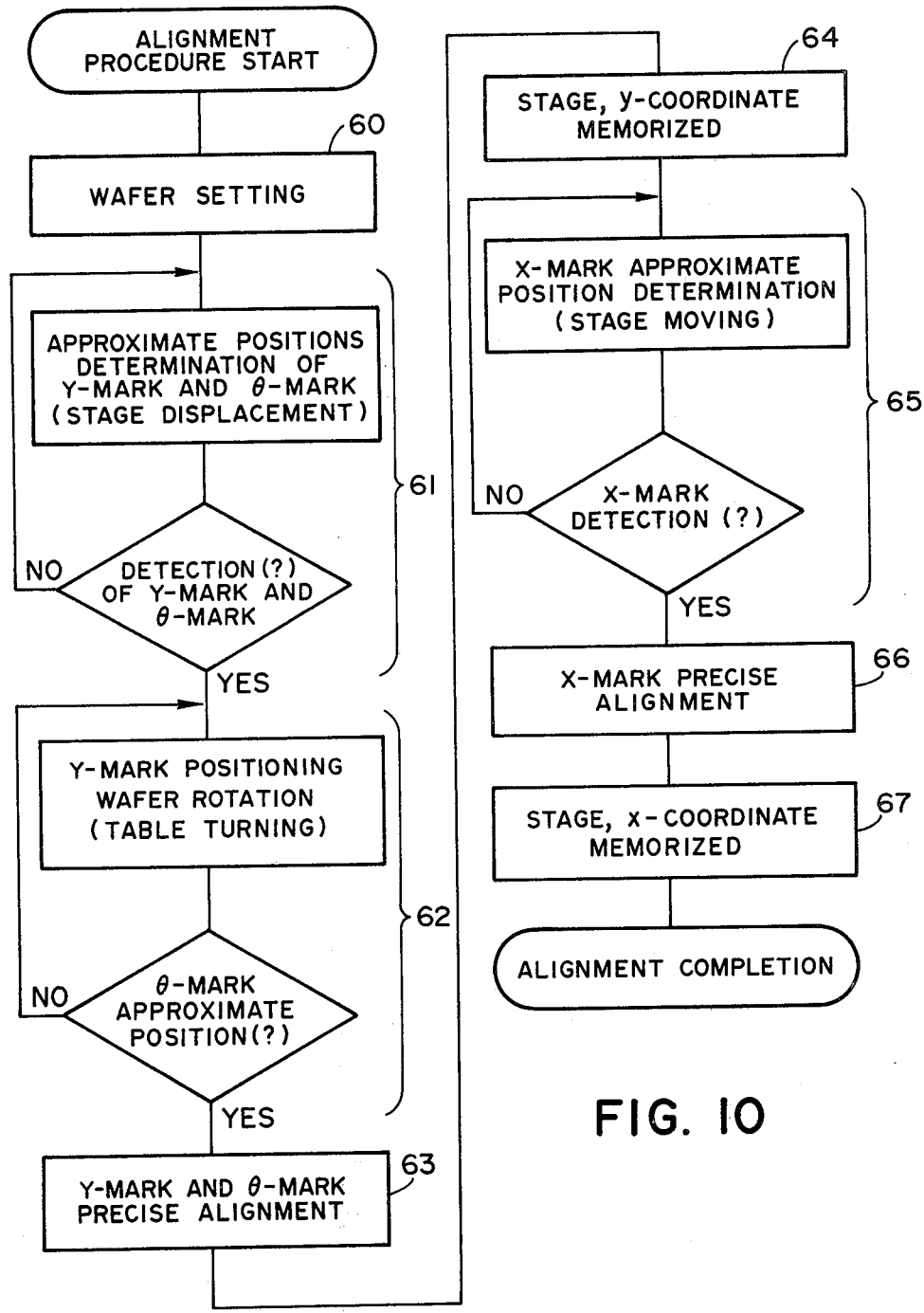
FIG. 10 is a flow chart showing the aligning procedure.

Now explained is the procedure of alignment by the above-explained apparatus while making reference to the flow chart shown in FIG. 10 in addition to FIGS. 8 and 9. The displacements of said table 49 and stage 48 are achieved by a processing system which is similar to that shown in FIG. 5 but is provided with three motor drive circuits 35 and with three motors respectively for moving in the x-axis direction, moving in the y-axis direction and rotation of the table 49, in order to process the photoelectric signals from the aforementioned three sensors and to selectively drive the table 49 and/or stage 48.

At the start of the alignment procedure, the wafer is mounted on the table 49 (step 60 in FIG. 10), with a positional precision of sub-millimeter order. Subsequently conducted is so-called trial scanning in which the stage 48 is displaced at a relatively high speed to a position in which the Y-mark 42 and θ-mark 44 are detected by the Y-sensor 52 and θ-sensor 54. Thus, in the step 61, the approximate positions of said Y-mark 42 and θ-mark 44 are determined by the aforementioned coordinate measuring device when the photoelectric signals from the respective sensors reach peak values. The detection of alignment mark is securely achieved if the length of said mark is selected in the order of 1 mm, which is larger than the error in the initial setting of wafer. Also an erroneous detection of a neighboring alignment mark is avoided since each integrated circuit chip usually has a side length of several millimeters.

Then the stage 48 is so displaced, according to the preceding approximate measurement of the position of Y-mark 42, as to bring said Y-mark 42 to the center of the Y-sensor 52 as shown in FIG. 9. In the preceding step of determining the approximate positions of Y-mark 42 and θ-mark 44 the aberration δ of said two marks in the y-axis direction and the direction thereof are determined, and the table 49 is thus rotated in the step 62 according to said value δ and the known distance l between the Y-sensor 52 and θ-sensor 54. In this manner the θ-mark 44 also is positioned roughly in the center of the θ-sensor 54, thus completing the approximate alignment of the Y-mark 52 and θ-mark 54. In the subsequent step 63 conducted is the precise alignment of said two marks, which is generally achieved in a similar manner as in the aforementioned one-dimensional positioning but involves the displacement of the stage 48 in the y-axis direction and the rotation of the table 49. Upon completion of the precise alignment in the y-axis direction, the y-coordinate is memorized in an unrepresented memory in the step 64. Subsequently conducted is a step 65 for determining approximate position of the X-mark 43, by displacing the stage 48 in the x-axis direction in FIG. 8 and detecting the stage position corresponding to the peak value in the photoelectric signal. Then the stage 48 is rapidly displaced, according to the result of said approximate measurement, so as that the X-mark 43 is positioned in the center of the X-sensor 53, and a precise alignment step 66 is conducted in a similar manner as explained in the foregoing. Upon completion of the precise alignment in the x-axis direction, the x-axis coordinate of the stage 48 is memorized in the step 67.

As the result of the above-explained alignment procedure, the wafer 40 is corrected in the rotational position thereof and in a position exactly aligned in the x- and y-axis directions, and the corresponding x- and y-axis coordinates are memorized in said memory and serve for bringing arbitrary points on the wafer to the optical axis of the projection lens 46, thereby enabling repetitive exposures to the pattern on the reticle in combination with the stepwise displacements in the x- and y-axis directions.

FIGS. 11A and 11B show enlarged views of the abovementioned alignment mark composed of a group of short line segments, in which the diffraction of light is caused at the edges of each segment.

FIG. 12A shows another embodiment of the alignment mark composed of chevron elements, in which case there are provided four detectors 58a–58d around the spot beam as shown in FIG. 12B.

Though the alignment in the foregoing has been achieved by the displacement of the wafer, it is naturally possible to achieve the alignment by displacing the photomask.

The Y-mark 42 and θ-mark 44 shown in FIG. 7 are positioned on a same street line, but they need not necessarily be so positioned depending on the positions of the corresponding Y-sensor 52 and θ-sensor 54. Furthermore each alignment mark may be positioned outside the street line, for example in a chip area.

Furthermore, in the foregoing embodiment the detection of alignment mark is achieved from the peak A in the photoelectric signal shown in FIG. 3, but it is also possible to detect the alignment mark, in case of peak detection by incorporating a small vibration into the laser spot beam, converting the photoelectric signal into a signal synchronized with said vibration and identifying the zero point in the smoothed output obtained by synchronized detection, from the peak value in the modulated component of the photoelectric signal or in the absolute value of the synchronized detection output signal.

In addition to the wafer alignment in the printing apparatus explained in the foregoing, the present invention is also applicable to other apparatus such as the LSI tester or the scriber, or to the positioning of objects with two-dimensional patterns.

We claim:

1. In a positioning apparatus having plural alignment marks provided in determined positions on an object to be aligned, means for projecting plural coherent light beams onto said object, means for causing two-dimensional relative scanning motion between said object and said coherent light beams, and plural detecting means for photoelectrically detecting the light diffracted from each of said coherent light beams by each of said alignment marks;

the improvement wherein said projecting means comprises plural converging means for forming each coherent light beam into a stripe-shaped beam extended in a direction substantially perpendicular to the scanning direction of said scanning means, and each of said alignment marks comprises plural short line segments arranged in a stripe extended in a direction substantially perpendicular to the scanning direction of said scanning means and each inclined approximately by 45° with respect to said scanning direction.

2. A positioning apparatus according to claim 1, wherein said scanning means comprises two-dimensional displacing means capable of supporting said object and displacing the same in at least two mutually perpendicular directions in a plane, said directions being perpendicular to the extended directions of said stripe-shaped beams.

3. A positioning apparatus according to claim 2, wherein said object comprises plural circuit pattern areas divided at least by a street line, and said alignment marks comprise first and second marks of which extended direction is substantially parallel to the direction of said street line, and a third mark of which extended direction is substantially perpendicular to the direction of said street line.

4. A positioning apparatus according to claim 3, wherein said object comprises at least a street line perpendicular to the first mentioned street line, and the first, second third marks are respectively positioned on the first mentioned street line and said perpendicular street line.

5. A positioning apparatus according to claim 3, wherein said converging means comprises first, second and third converging means positioned respectively corresponding to said first, second and third marks and adapted to form stripe-shaped beams substantially parallel respectively to the extended directions of said marks.

6. A positioning apparatus according to claim 5, wherein said detecting means comprises first detecting means for detecting said first mark, second detecting means for detecting said second mark, and third detecting means for detecting said third mark.

7. A positioning apparatus according to claim 3, wherein said two-dimensional displacing means comprises means for rotating said object around a point on said plane, and said detecting means comprises means for detecting the relative positional relation of said first and second marks resulting from the rotation of said object.

8. In a positioning apparatus having plural alignment marks provided in determined positions on an object to be aligned, means for projecting plural coherent light beams onto said object, means for causing two-dimensional relative scanning motion between said object and said coherent light beams, and plural detecting means for photoelectrically detecting the light diffracted from each of said coherent light beams by each of said alignment marks;

the improvement wherein said projecting means comprises plural converging means for forming each coherent light beam into a stripe-shaped beam extended in a direction substantially perpendicular to the scanning direction of said scanning means, and each of said alignment marks comprises plural short line segments arranged in a stripe extended in a direction substantially perpendicular to the scanning direction of said scanning means.

9. A positioning apparatus according to claim 8, wherein each of said plural short line segments is inclined by a determined angle with respect to said scanning direction.

10. A positioning apparatus for aligning an object comprising:
(a) alignment mark means provided in determined position on said object and having a plurality of short line segments arranged in a stripe pattern extended in a linear direction;
(b) means for projecting a coherent light beam onto said object including converging means for forming said light beam into an elongated beam extended in the same direction as said linear direction of said stripe pattern;
(c) scanning means for causing two-dimensional relative scanning motion between said object and said coherent light beam in a direction substantially perpendicular to said linear direction; and
(d) means for photoelectrically detecting the light diffracted from said coherent light beam by said alignment mark means.

11. A positioning apparatus according to claim 10, wherein said detecting means includes a pair of photoelectric detectors receiving diffracted light beams emitted to opposite sides of said coherent light beam respectively.

12. A positioning apparatus according to claim 10, wherein each of said plural short line segments is inclined by a determined angle with respect to said scanning direction.

13. A positioning apparatus according to claim 11, wherein said angle is approximately 45°.

14. A positioning apparatus according to claim 10, wherein said projecting means further includes a condenser lens and said coherent light beam is focused by said condenser lens onto said object, and said detecting means receives said diffracted light through said condenser lens.

* * * * *